United States Patent
Cho et al.

(10) Patent No.: US 11,594,376 B2
(45) Date of Patent: Feb. 28, 2023

(54) ELECTRONIC COMPONENT AND BOARD HAVING THE SAME MOUNTED THEREON

(71) Applicant: SAMSUNG ELECTRO-MECHANICS CO., LTD., Suwon-si (KR)

(72) Inventors: Beom Joon Cho, Suwon-si (KR); Won Young Jang, Suwon-si (KR); Hyeok Jin Park, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 0 days.

(21) Appl. No.: 17/208,181

(22) Filed: Mar. 22, 2021

(65) Prior Publication Data

US 2022/0076890 A1 Mar. 10, 2022

(30) Foreign Application Priority Data

Sep. 9, 2020 (KR) .................. 10-2020-0115241

(51) Int. Cl.
| | |
|---|---|
| H01G 4/30 | (2006.01) |
| H01G 4/232 | (2006.01) |
| H01G 2/06 | (2006.01) |
| H01G 4/12 | (2006.01) |
| H01G 4/012 | (2006.01) |

(52) U.S. Cl.
CPC .............. *H01G 4/30* (2013.01); *H01G 2/065* (2013.01); *H01G 4/012* (2013.01); *H01G 4/1209* (2013.01); *H01G 4/232* (2013.01)

(58) Field of Classification Search
CPC .......... H01G 4/224; H01G 4/248; H01G 4/30; H01G 4/38; H01G 4/012; H01G 4/1227; H01G 4/1245; H01G 4/065; H01G 4/0085; H01G 4/232; H01G 4/40; H01G 4/12;
(Continued)

(56) References Cited

U.S. PATENT DOCUMENTS

| 2001/0007522 A1* | 7/2001 | Nakagawa ............... H01G 4/38 |
| | | 361/301.4 |
| 2010/0188798 A1 | 7/2010 | Togashi et al. |

(Continued)

FOREIGN PATENT DOCUMENTS

| JP | 2004-273935 A | 9/2004 |
| KR | 10-2010-0087622 A | 8/2010 |
| KR | 10-2004804 B1 | 7/2019 |

*Primary Examiner* — Michael P McFadden
(74) *Attorney, Agent, or Firm* — Morgan, Lewis & Bockius LLP

(57) ABSTRACT

An electronic component and a board having the same mounted thereon are provided. The electronic component includes an electronic component including a capacitor array in which a plurality of multilayer capacitors including a capacitor body and a pair of external electrodes, respectively disposed on both end portions of the capacitor body in a first direction, are stacked in a second direction, perpendicular to the first direction, and a length of a multilayer capacitor, disposed on a lower end in the second direction, in the first direction is less than a length of another multilayer capacitor in the first direction; and a pair of metal frames, respectively disposed to be connected to the pair of external electrodes of the multilayer capacitor disposed on the lower end.

18 Claims, 10 Drawing Sheets

(58) Field of Classification Search
CPC ... H01G 4/1218; H01G 4/1209; H05K 1/0231
See application file for complete search history.

(56) References Cited

U.S. PATENT DOCUMENTS

| | | | |
|---|---|---|---|
| 2016/0219739 A1* | 7/2016 | Park | H01G 4/30 |
| 2016/0351333 A1* | 12/2016 | Ando | H01G 2/14 |
| 2017/0103852 A1* | 4/2017 | Ando | H01G 2/06 |
| 2017/0127520 A1* | 5/2017 | Park | H01G 4/12 |
| 2018/0122578 A1* | 5/2018 | Choi | H01G 4/232 |
| 2018/0350524 A1* | 12/2018 | Itamochi | H01G 4/232 |
| 2019/0066918 A1 | 2/2019 | Jeong et al. | |
| 2019/0069411 A1* | 2/2019 | Park | H05K 1/111 |
| 2019/0122823 A1* | 4/2019 | Cho | H01G 4/38 |
| 2020/0006003 A1* | 1/2020 | Jeong | H01G 4/008 |

* cited by examiner

ELECTRONIC COMPONENT AND BOARD HAVING THE SAME MOUNTED THEREON

CROSS-REFERENCE TO RELATED APPLICATION(S)

The present application claims the benefit of priority to Korean Patent Application No. 10-2020-0115241, filed on Sep. 9, 2020 in the Korean Intellectual Property Office, the entire disclosure of which is incorporated herein by reference.

TECHNICAL FIELD

The present disclosure relates to an electronic component and a board having the same mounted thereon.

BACKGROUND

Multilayer capacitors are used in various electronic devices due to a small size and high capacitance thereof.

Recently, due to fast growing interest in eco-friendly vehicles and electric vehicles, the importance of power driving systems in vehicles is increasing, and accordingly, demand for multilayer capacitors required for power driving systems is also increasing.

Multilayer capacitors are required to have high levels of thermal reliability, electrical reliability, and mechanical reliability, so as to be used as components for a vehicle.

With an increase in component-mounting density in a vehicle, there is demand for a multilayer capacitor which may be easily mounted in a limited space while implementing high capacitance and which may be highly resistant to vibrations and deformation.

To improve durability against such vibrations and deformation, a multilayer capacitor may be mounted on a board while being spaced apart from the board using a metal frame.

In addition, a plurality of multilayer capacitors may be stacked to implement high capacitance in a similar area.

However, in the case of an electronic component having a multi-stack structure using a metal frame, a length of the electronic component is increased by thicknesses of the metal frame and a conductive bonding layer. Therefore, a mounting area is increased by the increased length of the electronic component during board mounting. As a result, a design of an electrode pad of a board should be changed.

SUMMARY

An aspect of the present disclosure is to provide an electronic component, which may implement high capacitance and improve durability against vibrations and deformation and may be used without increasing a mounting area when mounted on a board and changing a design of an electrode pad of the board, and a board having the electronic component mounted thereon.

According to an aspect of the present disclosure, an electronic component includes a capacitor array in which a plurality of multilayer capacitors including a capacitor body and a pair of external electrodes, respectively disposed on both end portions of the capacitor body in a first direction, are stacked in a second direction, perpendicular to the first direction, and a length of a multilayer capacitor, disposed on a lower end in the second direction, in the first direction, is less than a length of another multilayer capacitor in the first direction; and a pair of metal frames, respectively disposed to be connected to the pair of external electrodes of the multilayer capacitor disposed on the lower end.

The capacitor body may include a dielectric layer and a plurality of internal electrodes alternately disposed with the dielectric layer interposed therebetween.

The external electrode may include a head portion, disposed on one surface of the capacitor body in the first direction, and a band portion extending from the head portion to portions of upper and lower surfaces of the capacitor body.

A conductive bonding layer may be disposed between band portions, facing each other, in multilayer capacitors adjacent to each other in the second direction.

The metal frame may include a connection portion, connected to the head portion, and a mounting portion bent to extend from a lower end of the connection portion in the first direction.

The mounting portion may be spaced apart from a lower end of the capacitor array.

The electronic component may further include a conductive bonding layer disposed between the connection portion and the head portion.

Two multilayer capacitors may be stacked from a lower end of the capacitor array in the second direction in such a manner that portions of band portions, facing each other, overlap each other in the second direction.

In addition, $\frac{2}{3} \leq B/A$, in which A is a length of the band portion of the multilayer capacitor, disposed on the lower end, in the first direction, and B is a length of the band portions, overlapping each other in the second direction, in the first direction.

A length of the band portions, overlapping each other in the second direction, in the first direction, may be 0.4 mm or more.

The metal frame may include a bonding portion, bent to extend from an upper end of the connection portion in the first direction, allowing the metal frame to be bonded to a band portion of a multilayer capacitor disposed on an upper side in the capacitor array.

The electronic component may further include a conductive bonding layer disposed between the bonding portion and the band portion of the multilayer capacitor disposed on the upper side in the capacitor array.

The metal frame may include an extension portion, bent to extend from an upper end of the connection portion in the first direction, and an auxiliary connection portion, bent to extend from the extension portion in the second direction, to be bonded to the head portion of the multilayer capacitor disposed on the upper side in the capacitor array.

The electronic component may further include a conductive bonding layer disposed between the auxiliary connection portion and the head portion of the multilayer capacitor disposed on the upper side in the capacitor array.

The auxiliary connection portion may be formed to expose a portion of the head portion of the multilayer capacitor disposed on the upper side in the capacitor array.

According to another aspect of the present disclosure, a board having an electronic component mounted thereon includes a board, having an upper surface on which a first electrode pad and a second electrode pad are provided, and an electronic component mounted in such a manner that a single mounting portion is connected to each of the first electrode pad and the second electrode pad.

BRIEF DESCRIPTION OF DRAWINGS

The above and other aspects, features, and advantages of the present disclosure will be more clearly understood from the following detailed description, taken in conjunction with the accompanying drawings.

DETAILED DESCRIPTION

Figure 1:
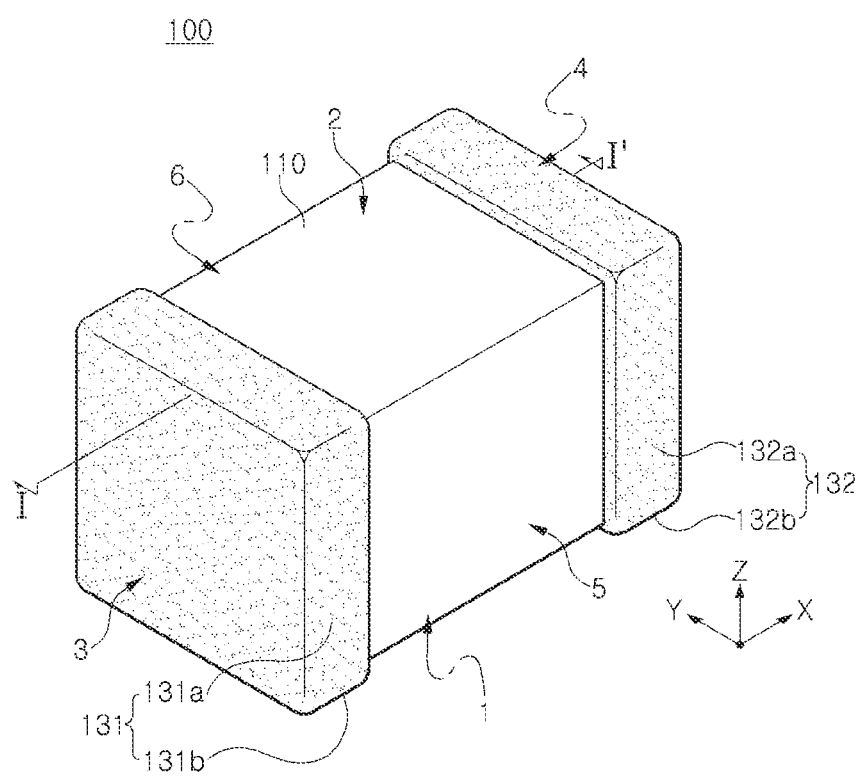
FIG. 1 is a schematic perspective view of a multilayer capacitor applied to an exemplary embodiment of the present disclosure.

Hereinafter, embodiments of the present disclosure will be described as follows with reference to the attached drawings.

The present disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

Throughout the specification, it will be understood that when an element, such as a layer, region or wafer (board), is referred to as being "on," "connected to," or "coupled to" another element, it can be directly "on," "connected to," or "coupled to" the other element or other elements intervening therebetween may be present. In contrast, when an element is referred to as being "directly on," "directly connected to," or "directly coupled to" another element, there may be no elements or layers intervening therebetween. Like numerals refer to like elements throughout. As used herein, the term "and/or" includes any and all combinations of one or more of the associated listed items.

It will be apparent that though the terms first, second, third, etc. may be used herein to describe various members, components, regions, layers and/or sections, these members, components, regions, layers and/or sections should not be limited by these terms. These terms are only used to distinguish one member, component, region, layer or section from another region, layer or section. Thus, a first member, component, region, layer or section discussed below could be termed a second member, component, region, layer or section without departing from the teachings of the exemplary embodiments.

Spatially relative terms, such as "above," "upper," "below," and "lower" and the like, may be used herein for ease of description to describe one element's relationship to another element(s) as shown in the figures. It will be understood that the spatially relative terms are intended to encompass different orientations of the device in use or operation in addition to the orientation depicted in the figures. For example, if the device in the figures is turned over, elements described as "above," or "upper" other elements would then be oriented "below," or "lower" the other elements or features. Thus, the term "above" can encompass both the above and below orientations depending on a particular direction of the figures. The device may be otherwise oriented (rotated 90 degrees or at other orientations) and the spatially relative descriptors used herein may be interpreted accordingly.

The terminology used herein describes particular embodiments only, and the present disclosure is not limited thereby. As used herein, the singular forms "a," "an," and "the" are intended to include the plural forms as well, unless the context clearly indicates otherwise. It will be further understood that the terms "comprises," and/or "comprising" when used in this specification, specify the presence of stated features, integers, steps, operations, members, elements, and/or groups thereof, but do not preclude the presence or addition of one or more other features, integers, steps, operations, members, elements, and/or groups thereof.

Hereinafter, embodiments of the present disclosure will be described with reference to schematic views illustrating embodiments of the present disclosure. In the drawings, for example, due to manufacturing techniques and/or tolerances, modifications of the shape shown may be estimated. Thus, embodiments of the present disclosure should not be construed as being limited to the particular shapes of regions shown herein, for example, to include a change in shape results in manufacturing. The following embodiments may also be constituted by one or a combination thereof.

The contents of the present disclosure described below may have a variety of configurations and propose only a required configuration herein, but are not limited thereto.

When orientations are defined to clearly describe an embodiment in the present disclosure, X, Y, and Z on the drawings indicate a length direction, a width direction, and a thickness direction of a multilayer capacitor and an electronic component, respectively.

Here, in an embodiment, a Z direction may be used as having the same as a stacking direction in which dielectric layers are stacked on each other.

Figure 2A:
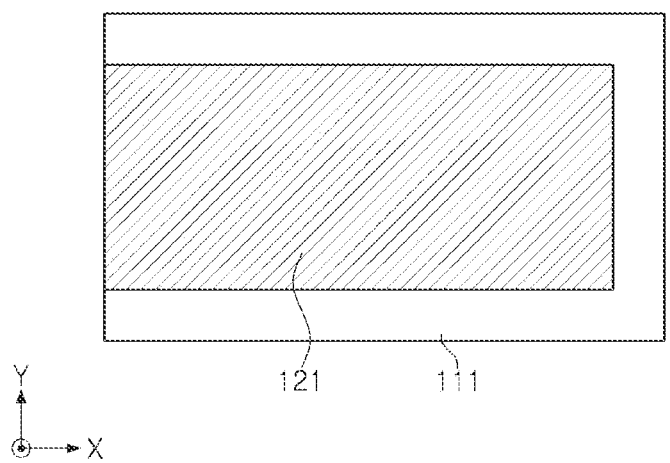
FIGS. 2A and 2B are plan views illustrating first and second internal electrodes, respectively, applied to the multilayer capacitor of FIG. 1.
Figure 2B:
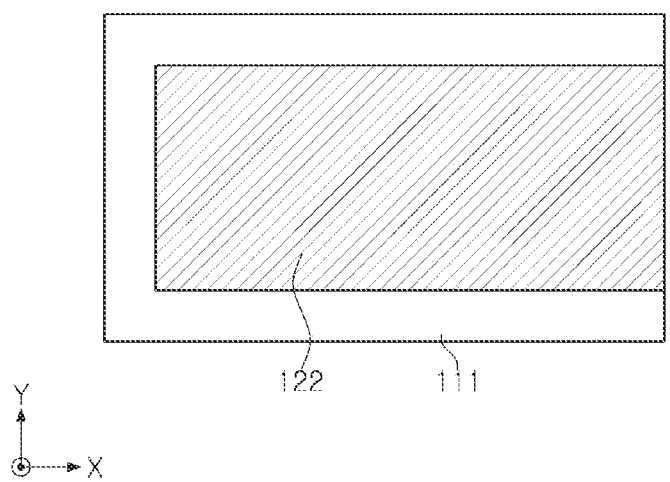
Figure 3:
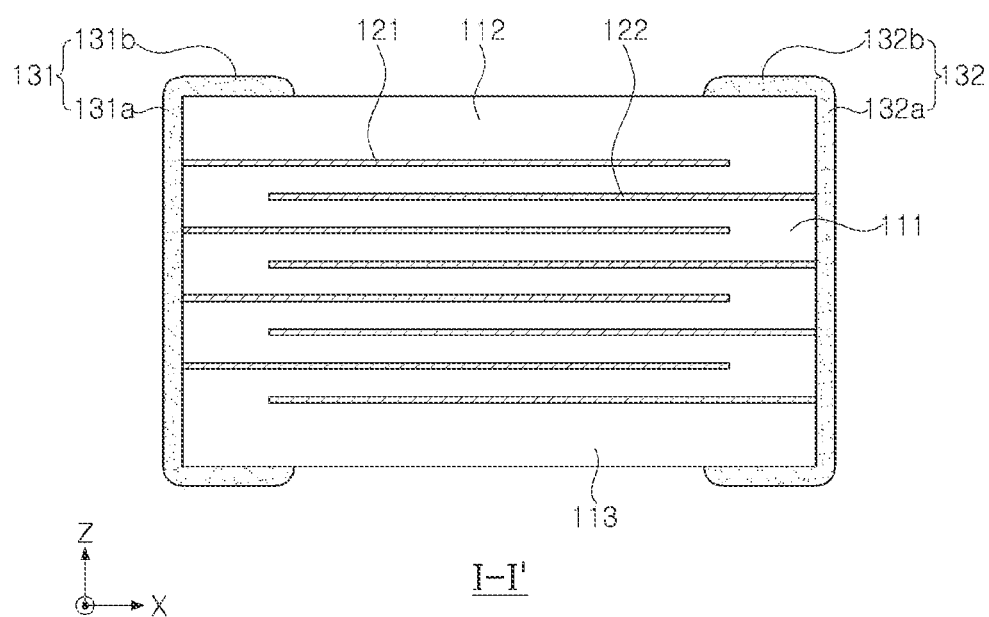
FIG. 3 is a cross-sectional view taken along line I-I' of FIG. 1.

FIG. 1 is a schematic perspective view of a multilayer capacitor applied to an exemplary embodiment, FIGS. 2A and 2B are plan views illustrating a first internal electrode and a second internal electrode, respectively, applied to the multilayer capacitor of FIG. 1, and FIG. 3 is a cross-sectional view taken along line I-I' of FIG. 1.

Hereinafter, a structure of a multilayer capacitor 100, applied to an electronic component of the present embodiment, will be described with referenced to FIGS. 1 to 3.

In addition, a second multilayer capacitor to be described later has a structure, in which a capacitor body and first and second electrodes are formed, similar to a structure of the first multilayer capacitor 100. Therefore, a description of the structure of the second multilayer capacitor will be omitted to avoid duplication.

The multilayer capacitor 10 may include a capacitor body 110, and first and second external electrodes 131 and 132, respectively disposed on both end portions of the body capacitor 110, in an X direction defined as a first direction.

The capacitor body 110 may be formed by laminating a plurality of dielectric layers 111 in a Z direction and sintering the laminated dielectric layers 111. Adjacent dielectric layers 111 of the capacitor body 110 are integrated such that boundaries therebetween are not readily apparent without using a scanning electron microscope (SEM).

The capacitor body 110 may include a plurality of dielectric layers 111 and first and second internal electrodes 121 and 122 alternately disposed in the Z direction with respective dielectric layers 111 interposed therebetween. The first and second internal electrodes 121 and 122 may have polarities opposite to each other.

The capacitor body 110 may include an active region and cover regions 112 and 113.

The active region is a portion contributing to formation of capacitance of a multilayer capacitor.

The cover regions 112 and 113 may be provided on upper and lower portions of the active region in the Z direction as margin portions, respectively. The cover regions 112 and 113 may be provided by laminating a single dielectric layer or at least two dielectric layers on an upper surface and a lower surface of the active region, respectively.

The cover regions 112 and 113 may serve to prevent damage to the first and second internal electrodes 121 and 122 due to physical or chemical stress.

The capacitor body 110 has a shape without limitation, and may have a hexahedral shape overall.

In the present embodiment, the capacitor body 110 may have a first surface 1 and a second surface 2, opposing each other in the Z direction, a third surface 3 and a fourth surface 4, connected to the first surface 1 and the second surface 2 and opposing each other in the X direction, and a fifth surface 5 and a sixth surface 6, connected to the first surface 1 and the second surface 2 and to the third surface 3 and the fourth surface 4 and opposing each other. The first surface 1 may be a mounting surface.

A shape and a dimension of the capacitor body 110 and the number of laminated dielectric layers 111 are not limited to those illustrated in the drawings of the present embodiment.

The dielectric layer 111 may include ceramic powder, for example, a $BaTiO_3$-based ceramic powder, or the like.

The $BaTiO_3$-based ceramic powder may be $(Ba_{1-x}Ca_x)TiO_3$, $Ba(Ti_{1-y}Ca_y)O_3$, $(Ba_{1-x}Ca_x)(Ti_{1-y}Zr_y)O_3$, $Ba(Ti_{1-y}Zr_y)O_3$, or the like, in which calcium (Ca), zirconium (Zr), or the like, is partially dissolved in $BaTiO_3$, but is not limited thereto.

A ceramic additive, an organic solvent, a plasticizer, a binder, a dispersant, and the like, may also be added to the dielectric layers 111.

The ceramic additive may include, for example, a transition metal oxide or a transition metal carbide, a rare earth element, magnesium (Mg), aluminum (Al), or the like The first and second internal electrodes 121 and 122 may be electrodes to which voltages having opposite polarities are applied. Each of the first and second internal electrodes 121 and 122 may be formed on the dielectric layer 111 and may be laminated in the Z direction.

The first and second internal electrodes 121 and 122 may be alternately disposed inside the capacitor body 110 to oppose each other in the Z direction with a single dielectric layer 111 interposed therebetween. In this case, the first and second internal electrodes 121 and 122 may be electrically insulated from each other by the dielectric layer 111 disposed therebetween.

In the present embodiment, a plurality of internal electrodes are illustrated and described as being laminated in the Z direction. However, the present disclosure is not limited thereto and may be applied to a structure in which internal electrodes are laminated in the Y direction, as necessary.

One end of the first internal electrode 121 may be exposed through the third surface 3 of the capacitor body 110. The end portion of the first internal electrode 121, exposed through the third surface 3 of the capacitor body 110, may be connected to the first external electrode 131, disposed on one end portion of the capacitor body 110 in the X direction, to be electrically connected thereto.

One end portion of the second internal electrode 121 may be exposed through the fourth surface 4 of the capacitor body 110. The end portion of the second internal electrode 122, exposed through the fourth surface 4 of the capacitor body 110, may be connected to the second external electrode 132, disposed on one end portion of the capacitor body 110 in the X direction, to be electrically connected thereto.

According to the above configuration, when a predetermined voltage is applied to the first and second external electrodes 131 and 132, charges are accumulated between the first and second internal electrodes 121 and 122.

In this case, the capacitance of the multilayer capacitor 100 may be proportional to an area of overlap between the first and second internal electrodes 121 and 122, overlapping in the Z direction in the active region.

A material, forming the first and second internal electrodes 121 and 122, is not necessarily limited.

For example, the first and second internal electrodes 121 and 122 may be formed using a precious metal material or a conductive paste formed of at least one of nickel (Ni) and copper (Cu). The precious metal material may be platinum (Pt), palladium (Pd), a palladium-silver (Pd—Ag) alloy, or the like.

In this case, a method of printing the conductive paste may be such as screen printing or gravure printing may be used, but the present disclosure is not limited thereto.

Voltages, having opposite polarities, may be provided to the first and second external electrodes 131 and 132. The first and second external electrodes 131 and 132 may be disposed on both end portions of the body 110 in the X direction and may be connected to exposed portions of the first and second electrodes 121 and 122, respectively, to be electrically connected to each other.

The first external electrode 131 may include a first head portion 131a and a first band portion 131b.

The first head portion 131a may be disposed on the third surface 3 of the body 110. The first head portion 131 may be in contact with an end portion exposed to an external entity through the third surface 3 of the capacitor body 110 in the first internal electrode 121 to electrically connect the first internal electrode 121 and the first external electrode 131 to each other.

The first band portion 131b is a portion extending from the first band portion 131a to portions of the first, second, fifth, and sixth surfaces 1, 2, 5, and 6, of the body 110. The first band portion may serve to improve adhesive strength.

The second external electrode 132 may include a second head portion 132a and a second band portion 132b.

The second head portion 132a may be disposed on the fourth surface 4 of the body 110. The second head portion 132a may be in contact with an end portion exposed to an external entity through the fourth surface 4 of the body 110 in the second internal electrode 122 to electrically connect the second internal electrode 122 and the second external electrode 132 to each other.

The second band portion 132b is a portion extending from the second band portion 132a to a portion of the first, second, fifth, and sixth surfaces 1, 2, 5, and 6 of the body 110.

The second band portion 132b may serve to improve adhesive strength, or the like.

The second band portion 132b may further extend to a portion of the fifth and sixth surfaces 5 and 6 of the capacitor body 110, as necessary for further improvement of adhesive strength.

The first and second external electrodes 131 and 132 may further include a plating layer.

The plating layer includes first and second nickel (Ni) plating layers, disposed on the capacitor body 110, and first and second tin (Sn) plating layers, respectively covering the first and second nickel (Ni) plating layers.

Figure 4:
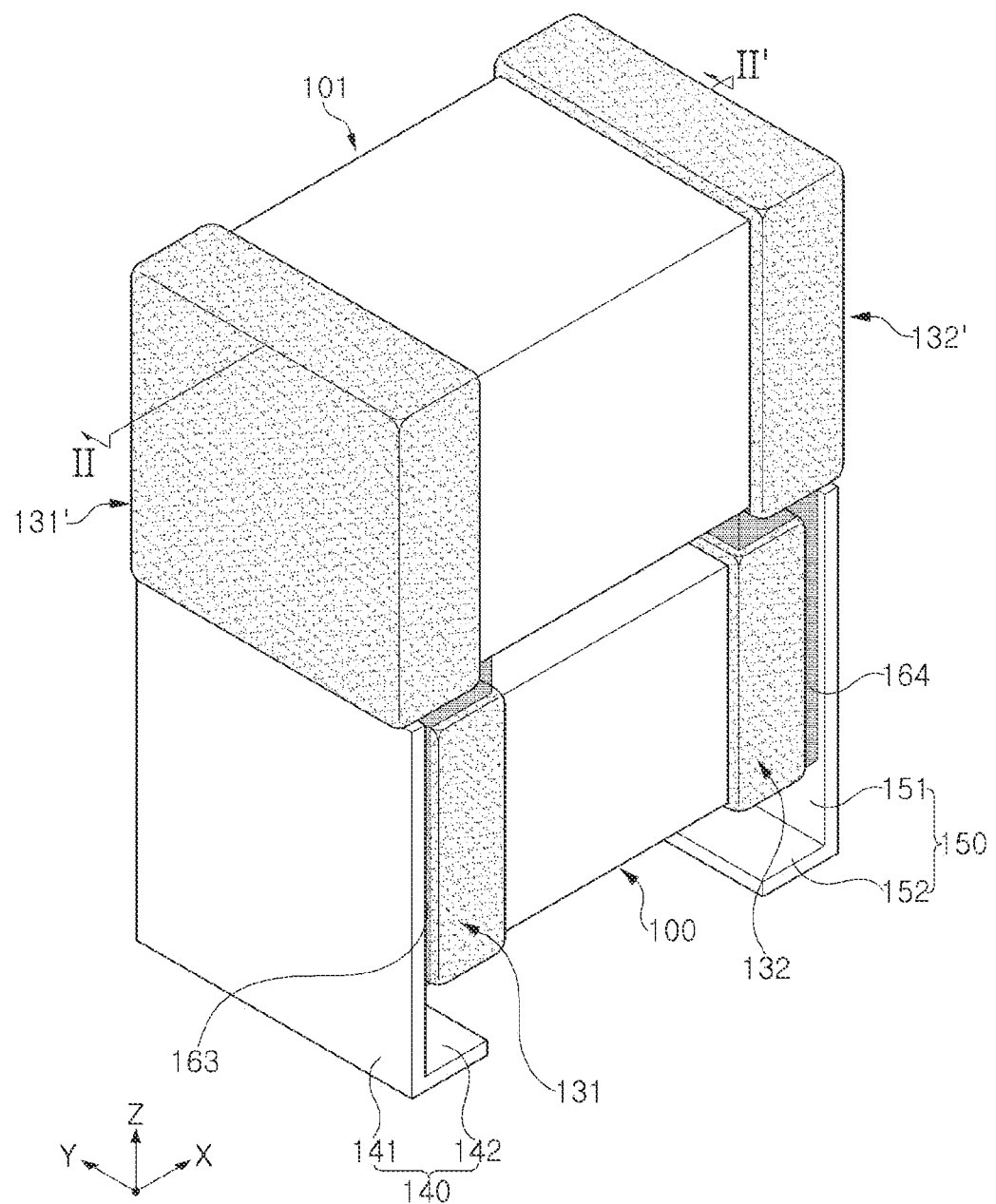
FIG. 4 is a perspective view illustrating a schematic structure of an electronic component according to an exemplary embodiment of the present disclosure.
Figure 5:
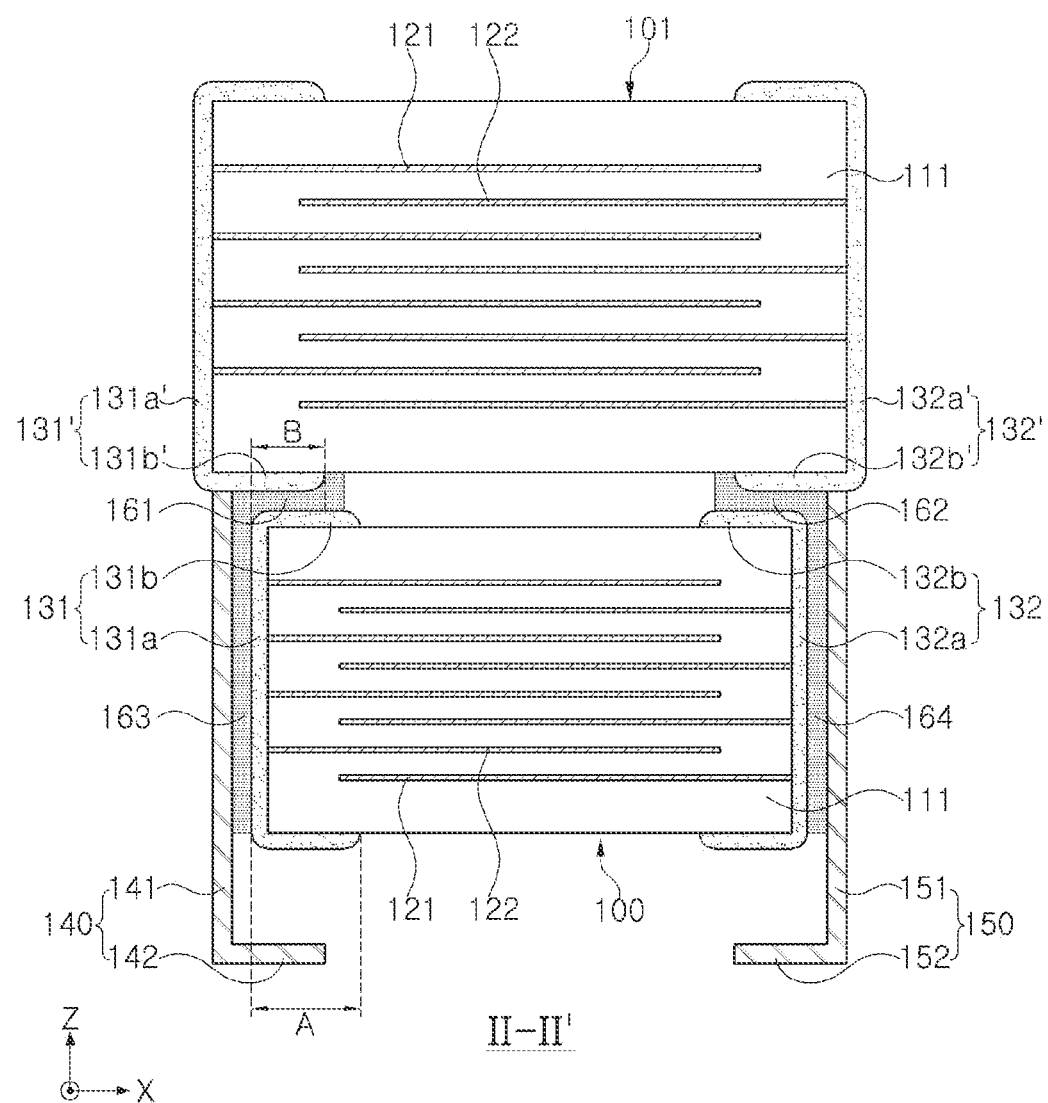
FIG. 5 is a cross-sectional view taken along line II-II' of FIG. 4.

FIG. 4 is a perspective view illustrating a schematic structure of an electronic component according to an exemplary embodiment, and FIG. 5 is a cross-sectional view taken along line II-II' of FIG. 4.

An electronic component according to the present disclosure includes a capacitor array in which a plurality of multilayer capacitors including a capacitor body and a pair of external electrodes, respectively disposed on both end portions of the capacitor body in a first direction, are stacked in a second direction, perpendicular to the first direction, and a length of a multilayer capacitor, disposed on a lower end in the second direction, in the first direction is less than a length of another multilayer capacitor in the first direction; and a pair of metal frames, respectively disposed to be connected to the pair of external electrodes of the multilayer capacitor disposed on the lower end.

In the present disclosure, a capacitor array is illustrated and described as including two multilayer capacitors stacked in a Z direction. However, the present disclosure is not limited thereto, and a capacitor array according to the present disclosure may be configured in such a manner that three or more multilayer capacitors are stacked in the Z direction.

Referring to FIGS. 4 and 5, an electronic component according to the present embodiment may include a capacitor array, including a plurality of multilayer capacitors, and first and second frames 140 and 150.

In the present disclosure, the capacitor array may include a first multilayer capacitor 100, disposed below, and a second multilayer capacitor 101 disposed above. The first multilayer capacitor 100 and the second multilayer capacitor 101 are stacked in the Z direction.

In this case, a length of the first multilayer capacitor 100 in an X direction may be less than a length of the second multilayer capacitor 101 in the X direction.

As necessary, a length of the first multilayer capacitor 100 in a Y direction may also be less than a length of the second multilayer capacitor 101 in the Y direction.

The second multilayer capacitor 101 may include a third external electrode 131', having a third head portion 131a' and a third band portion 131b', and a fourth external electrode 132' having a fourth head portion 132a' and a fourth band portion 132b'.

In the first and second multilayer capacitors 100 and 101 adjacent to each other in the Z direction, a conductive bonding layer 161 may be disposed between a first band portion 131b and the third band portion 131b' facing each other in the Z direction, and a conductive bonding layer 162 may be disposed between a second band portion 132b and the fourth band portion 132b' facing each other in the Z direction.

In the capacitor array, the first and second metal frames 140 and 150 may be disposed to be connected to the first and second external electrodes 131 and 132 of the first multilayer capacitor 100, respectively.

The first metal frame 140 may include a first connection portion 141 and a first mounting portion 142.

The first connection portion 141 may be bonded to the first head portion 131a of the first external electrode 131 of the first multilayer capacitor 100 to be physically connected thereto, and may be electrically connected to the first head portion 131a of the first external electrode 131.

In this case, the first connection portion 141 may be formed such that an upper end of the first connection portion 141 is in physical contact with the third band portion 131b' of the third external electrode 131'.

A conductive bonding layer 163 may be disposed between the first head portion 131a of the external electrode 131 and the first connection portion 141.

The conductive bonding layer 163 may be connected to the conductive bonding layer 161, disposed between the first and third band portions 131b and 131b', to be integrally provided.

The conductive bonding layer 163 may be formed of a high-temperature solder, a conductive bonding material, or the like, but the present disclosure is not limited thereto.

The first mounting portion 142 may be bent to extend inwardly of the first connection portion 141 from a lower end of the first connection portion 141 in a horizontal direction with respect to a mounting surface.

The first mounting portion 142 may serve as a connection terminal when the electronic component is mounted on a board.

In this case, the first mounting portion 142 may be disposed to be spaced apart from a lower end of the first multilayer capacitor 100.

The second metal frame 150 may include a second connection portion 151 and a second mounting portion 152.

The second connection portion 151 may be bonded to the second head portion 132a of the second external electrode 132 to be physically connected thereto, and may be electrically connected to the second head portion 132a of the second external electrode 132.

In this case, the second connection portion 151 may be formed in such a manner that an upper end of the second connection portion 151 is in physical contact with the fourth band portion 132b' of the fourth external electrode 132' of the second multilayer capacitor 101.

A conductive bonding layer 164 may be disposed been the second head portion 132a of the second external electrode 132 and the second connection portion 151.

The conductive bonding layer 164 may be connected to the conductive bonding layer 166, disposed between the second and fourth band portions 132b and 132b', to be integrally provided.

The conductive bonding layer 164 may be formed of a high-temperature solder, a conductive bonding material, or the like, but the present disclosure is not limited thereto.

The second mounting portion 152 may be bent to extend inwardly of the second connection portion 151 from a lower end of the second connection portion 151 in a horizontal direction with respect to the mounting surface.

The second mounting portion 152 may serve as a connection terminal when the electronic component is mounted on the board.

In this case, the second mounting portion 152 may be disposed to be spaced apart from a lower end of the first multilayer capacitor 100.

According to the present embodiment, the first and second multilayer capacitors 100 and 101 may be stacked in the Z direction to increase capacitance of the electronic component.

The first and second metal frames 140 and 150 may be bonded to the first and second external electrodes 131 and 132. In this case, a length of the first multilayer capacitor 100, close to the mounting surface of the board, in the X direction may be less than a length of the second multilayer capacitor 101, disposed above, in the X direction.

As compared to the case in which a second multilayer capacitor is directly mounted on a board without a metal frame when an electronic component is mounted on the board, in the present embodiment, amounting area of the electronic component may not be increased and an electrode pad of the board may be used, as it is, without changing an existing design for a size and a position of the electrode pad.

In this case, when the length of the first multilayer capacitor 100 in the X direction, thicknesses of the conductive bonding layers 163 and 164 and the first and second connection portions 141 and 151 of the first and second metal frames 140 and 150, and the like, are adjusted, a length from an external end surface of the first connection portion 141 in the X direction to an external end surface of the second connection portion 151 in the X direction may be similar to or less than the length of the second multilayer capacitor 101 in the X direction.

A conductive bonding layer 163 may be disposed between the first head portion 131a of the first external electrode 131 of the first multilayer capacitor 100 and the first connection portion 141 of the first metal frame 140, and a conductive bonding layer 161 may be disposed between the first band portion 131b of the first external electrode 131 and the third band portion 131b' of the third external electrode 131' facing each other in the Z direction. Thus, bonding strength between the first and second multilayer capacitors 100 and 101 and bonding strength between the first multilayer capacitor 100 and the first metal frame 140 may be improved.

In addition, a conductive bonding layer 164 may be disposed between the second head portion 132a of the second external electrode 132 of the first multilayer capacitor 100 and the second connection portion 151 of the second metal frame 150, and a conductive bonding layer 162 may be disposed between the second band portion 132b of the second external electrode 132 and the fourth band portion 132b' of the fourth external electrode 132' facing each other in the Z direction. Thus, bonding strength between the first and second multilayer capacitors 100 and 101 and bonding strength between the first multilayer capacitor 100 and the second metal frame 150 may be improved.

In the capacitor array, two multilayer capacitors may be stacked from a lower end in the Z direction in such a manner that portions of band portions, facing each other, may overlap each other in the Z direction.

In the present embodiment, a portion of the first band portion 131b of the first external electrode 131 of the first multilayer capacitor 100 and a portion of the third band portion 131b' of the third external electrode 131' of the second multilayer capacitor 101 may overlap each other in the Z direction.

In addition, a portion of the second band portion 132b of the second external electrode 132 of the first multilayer capacitor 100 and a portion of the fourth band portion 132b' of the fourth external electrode 132' of the second multilayer capacitor 101 may overlap each other in the Z direction.

In the present embodiment, ⅔≤B/A in which 'A' is a length of the first band portion 131b of the first multilayer capacitor 101 in the X direction, and 'B' is a length of the third band portion 131b', overlapping the first band portion 131b in the Z direction, in the X direction.

The length B of the third band portion 131b', overlapping the first band portion 131b in the Z direction, in the X direction may be, in detail, 0.4 mm or more.

In the present disclosure, ⅔≤B/A in which 'A' is a length of the second band portion 132b of the first multilayer capacitor 101 in the X direction and 'B' is a length of the fourth band portion 132b', overlapping the second band portion 132b in the Z direction, in the X direction.

The length B of the fourth band portion 132b', overlapping the second band portion 132b in the Z direction, in the X direction may be, in detail, 0.4 mm or more.

Figure 7:
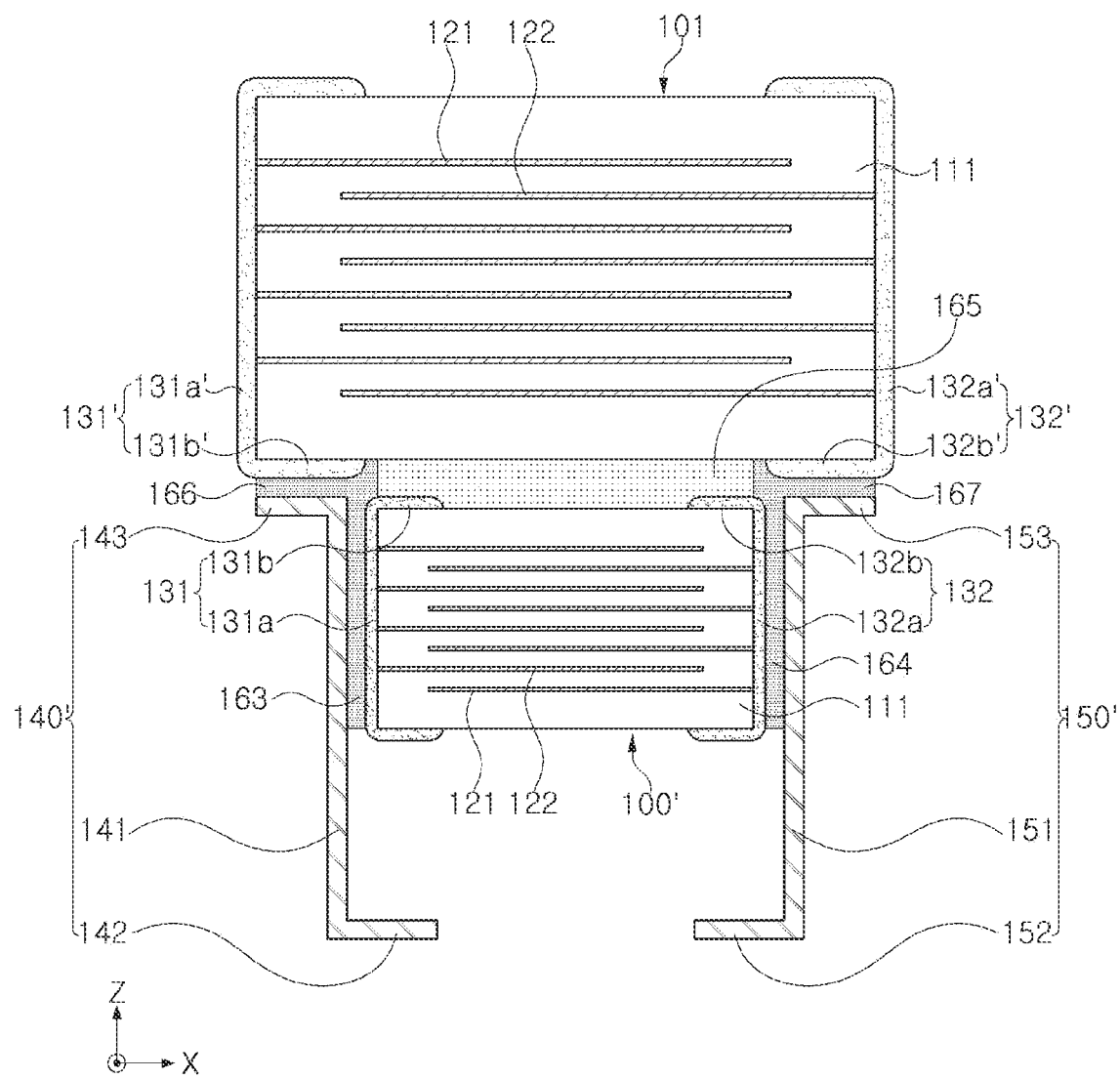
FIG. 7 is a cross-sectional view of an electronic component according to another exemplary embodiment of the present disclosure.

FIG. 7 is a cross-sectional view of an electronic component according to another exemplary embodiment of the present disclosure.

Referring to FIG. 7, a first metal frame 140' may further include a first bonding portion 143.

The first bonding portion 143 may be bent to extend outwardly of a first connection portion 141 from an upper end of the first connection portion 141 in an X direction.

The first bonding portion 143 may be bonded to a third band portion 131b' of a second multilayer capacitor 101, disposed above in a capacitor array, to support the third band portion 131b'.

In this case, a conductive bonding layer 166 may be disposed between the first bonding portion 143 and the third band portion 131b' of the second multilayer capacitor 101.

The conductive bonding layer 166 may be integrally connected to a conductive bonding layer 163 disposed between the first connection portion 141 and a first head portion 131a.

A second metal frame 150' may further include a second bonding portion 153.

The second bonding portion 153 may be bent to extend outwardly of a second connection portion 151 from an upper end of the second connection portion 151 in the X direction.

The second bonding portion 153 may be bonded to a fourth band portion 132b' of a second multilayer capacitor 101, disposed above in the capacitor array, to support the fourth band portion 132b.

In this case, a conductive bonding layer 167 may be disposed between the second bonding portion 153 and a fourth band portion 142b' of the second multilayer capacitor 101.

The conductive bonding layer 167 may be integrally connected to a conductive bonding layer 164 disposed between the second connection portion 151 and a second head portion 132a.

In the present embodiment, the first multilayer capacitor 100' may be formed to have a smaller size than in the exemplary embodiment of FIG. 5 such that the first and second metal frames 140' and 150' include the first and second bonding portions 143 and 153, respectively.

Therefore, a portion in which the first band portion 131b and the third band portion 131b' overlap each other in a Z direction may be significantly small or may not exist. In addition, a portion in which the second band portion 132b and the fourth band portion 132b' overlap each other in the Z direction may be significantly small or may not exist.

In the present embodiment, in the case of the above-described structure, adhesive strength between the first multilayer capacitor 100' and the second multilayer capacitor 101 may be reduced, as compared with the exemplary embodiment of FIG. 5.

Accordingly, a non-conductive bonding layer 165 may be disposed in an empty space between an upper surface of a capacitor body of the first multilayer capacitor 100' and a lower surface of a capacitor body of the second multilayer capacitor 101.

The non-conductive bonding layer 165 may compensate for the reduced adhesive strength between the first and second multilayer capacitors 100' and 101.

The non-conductive bonding layer 165 may include epoxy, or the like, but the present disclosure does not limit a material of the non-conductive bonding layer 165.

Figure 8:
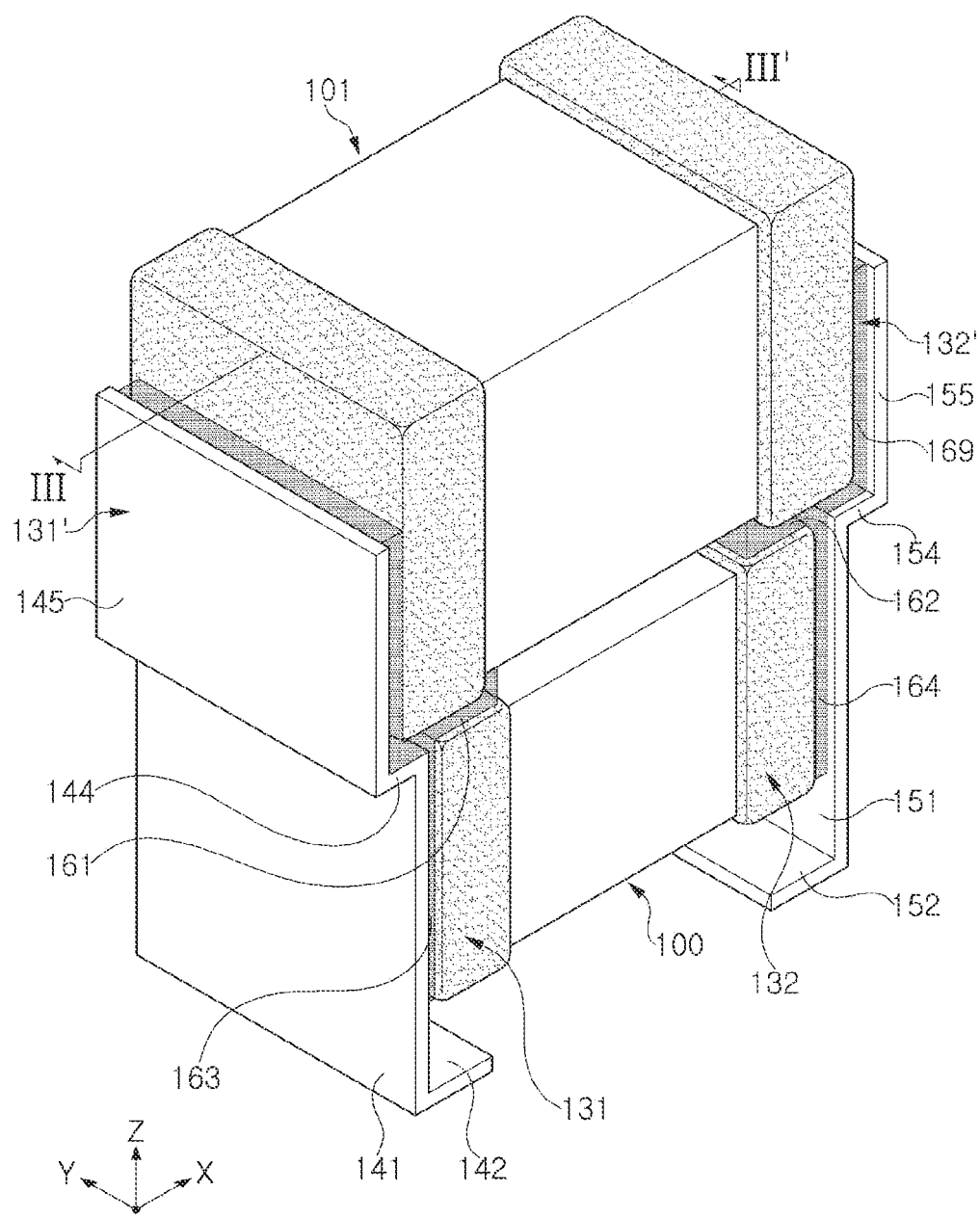
FIG. 8 is a perspective view illustrating a schematic structure of an electronic component according to another exemplary embodiment of the present disclosure.
Figure 9:
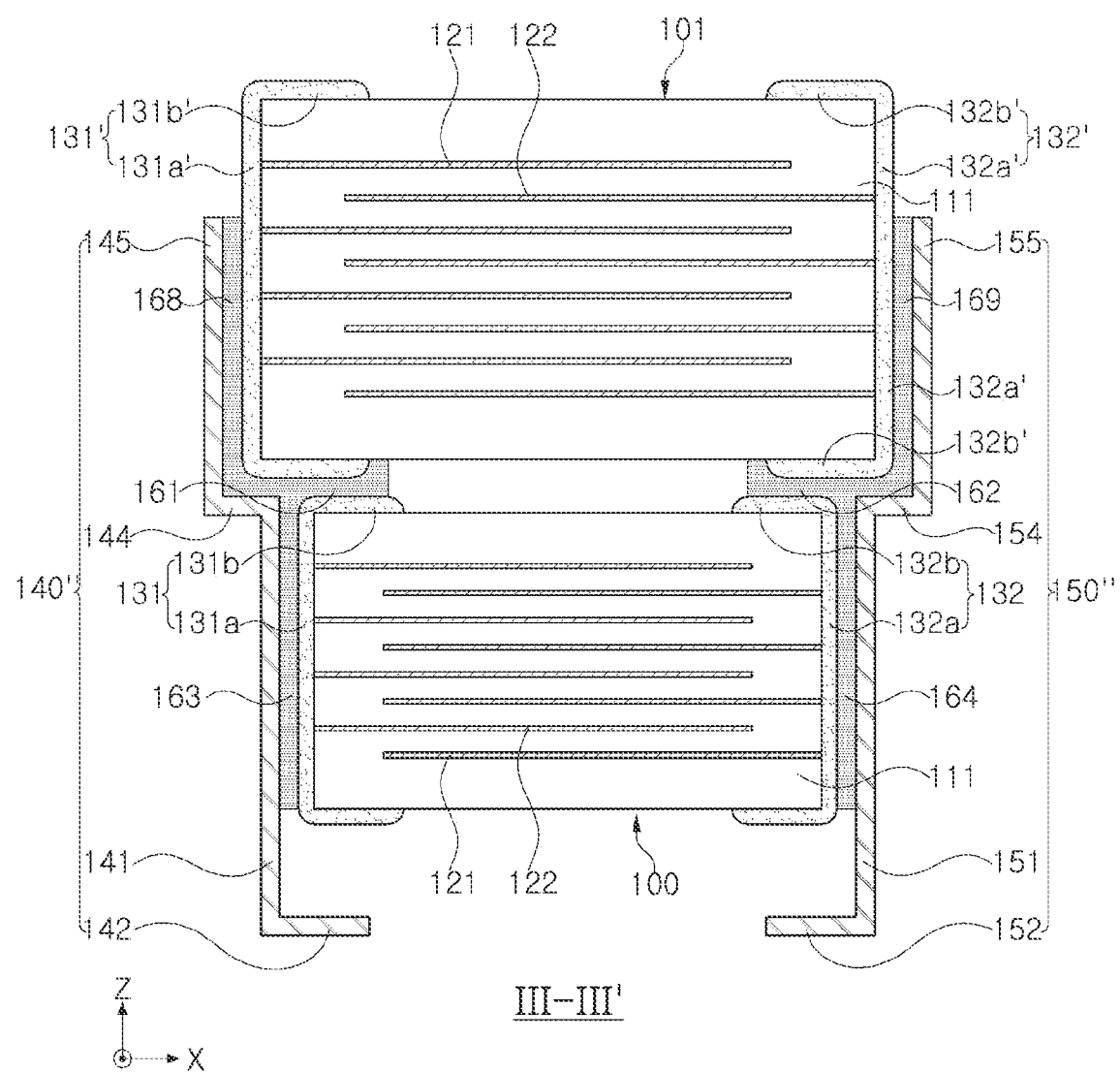
FIG. 9 is a cross-sectional view taken along line III-III' of FIG. 8.

FIG. 8 is a perspective view illustrating a schematic structure of an electronic component according to another exemplary embodiment, and FIG. 9 is a cross-sectional view taken along line III-III' of FIG. 8.

Referring to FIGS. 8 and 9, a first metal frame 140" may include a first extension portion 144 and a first auxiliary connection portion 145.

The first auxiliary connection portion 145 may be bonded to a third head portion 131a' of a second multilayer capacitor 101 disposed above in a capacitor array. To this end, the first auxiliary connection portion 145 may be bent to extend upwardly of the first extension portion 144 from an end portion of the first extension portion 144 in a Z direction.

In this case, a conductive bonding layer 168 may be disposed between the first auxiliary connection portion 145 and the third head portion 131a' of the second multilayer capacitor 101 disposed above in the capacitor array.

The conductive bonding layer 168 may be integrally connected to a conductive bonding layer 163, disposed between a first connection portion 141 and a first head portion 131a, and a conductive bonding layer 161 disposed between first and third band portions 131b and 131b'

The first auxiliary connection portion 145 may be formed to expose a portion of the third head portion 131a' of the second multilayer capacitor 101.

For example, a length of the first auxiliary connection portion 145 in the Z direction may be less than a length of the third head portion 131a' in the Z direction.

A second metal frame 150" may include a second extension portion 154 and a second auxiliary connection portion 155.

The second auxiliary connection portion 155 may be bonded to a fourth head portion 132a' of the second multilayer capacitor 101 disposed above in the capacitor array. To this end, the second auxiliary connection portion 155 may be bent to extend upwardly of the second extension portion 154 from an end portion of the second extension portion 154 in the Z direction.

In this case, a conductive bonding layer 169 may be disposed between the second auxiliary connection portion 155 and the fourth head portion 132a' of the second multilayer capacitor 101 disposed above in the capacitor array.

The conductive bonding layer 169 may be integrally connected to a conductive bonding layer 164, disposed between a second connection portion 151 and a second head portion 132a, and a conductive bonding layer 162 disposed between second and fourth band portions 132b and 132b'.

The second connection portion 155 may be formed to expose the fourth head portion 132a' of the second multilayer capacitor 101.

For example, a length of the second auxiliary connection portion 155 in the Z direction may be less than a length of the fourth head portion 132a' in the Z direction.

Figure 10:
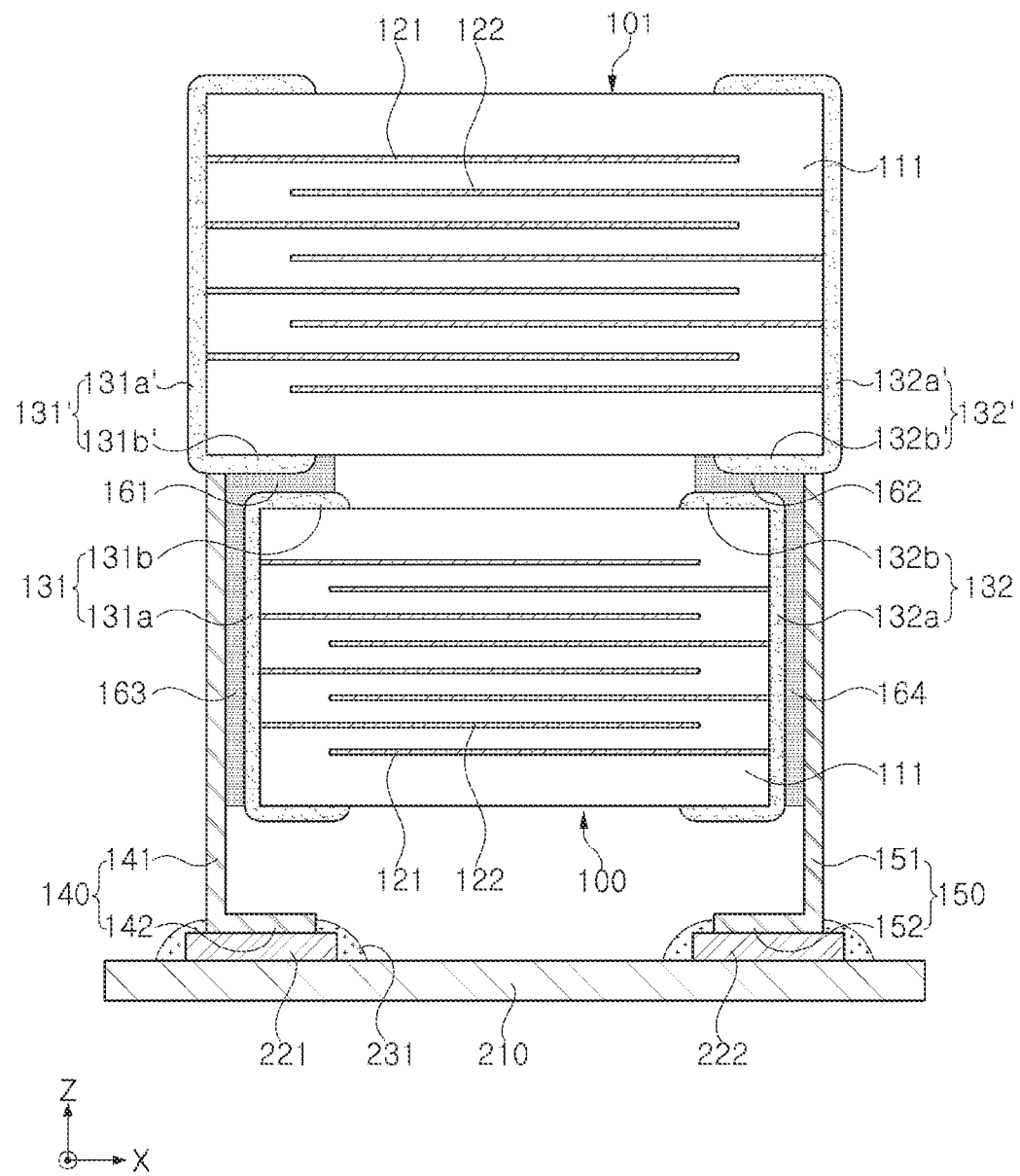
FIG. 10 is a cross-sectional view illustrating a state in which the electronic component of FIG. 5 is mounted on a board.

FIG. 10 is a cross-sectional view illustrating a state in which the electronic component of FIG. 5 is mounted on a board.

Referring to FIG. 10, a mounting board according to the present disclosure may include a board 210 and first and second connection pads 221 and 222 disposed to be spaced apart from each other on an upper surface of the board 210.

In the present embodiment, the electronic component may be connected in the state, in which first and second mounting portions 142 and 152 of first and second metal frames 140 and 150 are in contact with first and second electrode pads 221 and 222, respectively, to be mounted on the board 210.

In this case, the first mounting portion 142 may be bonded to the first electrode pad 222 by a solder 231 be electrically and physically connected thereto, and the second mounting portion 152 may be bonded to the second electrode pad 222 by a solder 232 to be electrically and physically connected thereto.

A multilayer capacitor according to the related art has a structure in which an external electrode of the multilayer capacitor and a board are in direct contact with each other due to a solder.

Accordingly, since thermal or mechanical deformation occurring in the board is directly transferred to the multilayer capacitor, it may be difficult for the multilayer capacitor to secure a high level of reliability.

In the electronic component according to the present embodiment, the first and second metal frames 140 and 150 may be bonded to both end portions of a first multilayer capacitor 100, respectively, to secure spacing between the multilayer capacitor 100 and the board 210.

Thus, stress from the board 210 is not directly transferred to the multilayer capacitor 100 when the electronic component 101 is mounted on the board 210. As a result, thermal reliability, electrical reliability, mechanical reliability, and the like of the electronic component 101 may be improved.

Additionally, in the electric component according to the present embodiment, the second multilayer capacitor may be stacked on the first multilayer capacitor to secure high capacitance.

In the case of a stack-type electronic component according to the related art, a total length of the electronic component is increased by thicknesses of a metal frame and a conductive bonding layer. Thus, a mounting area is increased by the increased length of the electronic component when the electronic component is mounted on a board, and a design of an electronic pad of the board should be changed.

In the present embodiment, a length of the first multilayer capacitor 100, close to a mounting surface of the board, in an X direction is less than a length of the second multilayer capacitor 101 in the X direction.

Accordingly, a total length of the electronic component in the X direction is similar to or less than the length of the second multilayer capacitor in the X direction. As a result, the mounting area may not be increased when the electronic component is mounted on the board, and an electrode pad of the board may be used, as it is, without changing a design of the electrode pad.

Figure 6:
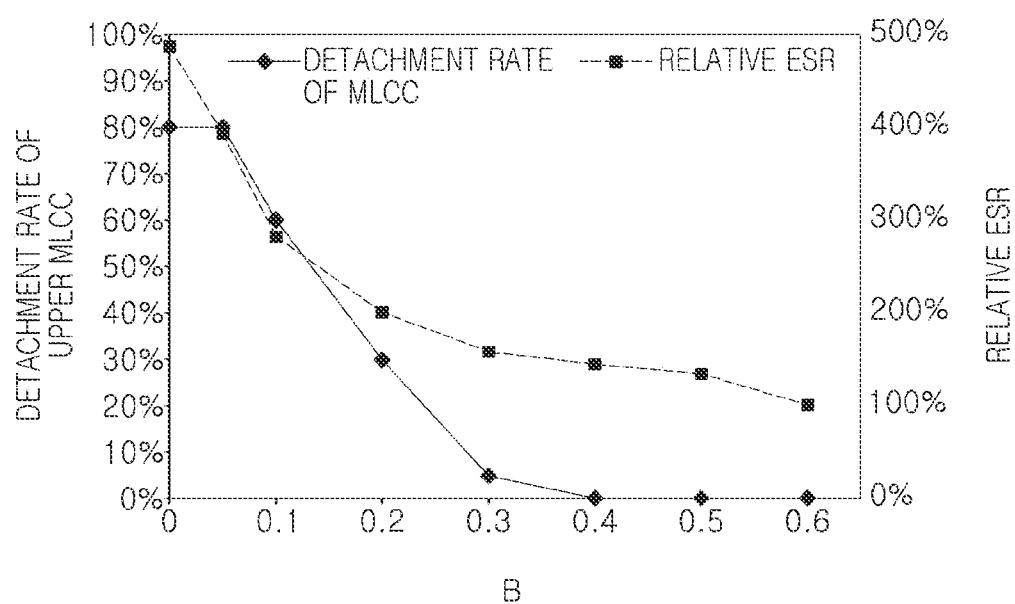
FIG. 6 is a graph illustrating that a detachment rate and relative ESR of a multilayer capacitor disposed above vary depending on an overlapping length of band portions, vertically facing each other, in a capacitor array of an electronic component according to an exemplary embodiment of the present disclosure.

FIG. 6 is a graph illustrating that a detachment rate and relative equivalent series resistance (ESR) of a multilayer capacitor disposed above vary depending on an overlapping length of band portions, vertically facing each other, in a capacitor array of an electronic component according to an exemplary embodiment of the present disclosure.

The following test will be described, based on a length at which first and third band portions overlap each other.

However, the description of the following test may be equivalently applied to a length at which second and fourth band portions overlap each other.

ESR of an electronic component, including vertically stacked first and second multilayer capacitors, and adhesive strength between the first and second multilayer capacitors of the electronic component are tested after 20 electronic components are mounted on a printed circuit board (PCB) such that each overlapping length B, at which a first band portion and a third band portion overlap each other in a Z direction, has a difference of 0.1 mm.

In this case, the overlapping length B, at which the first band portion and the third band portion overlap each other, may be measured using an optical microscope in a direction, perpendicular to a mounting surface of the board.

The ESR of the electronic component depending on the overlapping length B, at which the first band portion and the third band portion overlap each other, is measured as relative ESR depending on a decrease in the overlapping length B, based on ESR when the overlapping length B is 0.6 mm, and is illustrated in FIG. 6.

A minimum size of a multilayer capacitor, capable of performing a multi-stacking process, is about 1.6 mm in length and about 0.8 mm in width.

In this case, a band portion of an external electrode of a multilayer capacitor has a length of 0.6 mm or more. For this reason, 0.6 mm is set as a reference value of the length B when the first and third band portions fully overlap each other.

In a test for adhesive strength between the first and second multilayer capacitors, in an electronic component mounted on a PCB, force of 15N was applied to the second multilayer capacitor at a rate of 1 mm/min for 10 seconds. A case in which the second multilayer capacitor was detached from the first multilayer capacitor was evaluated as detachment, and a detachment rate thereof is illustrated in FIG. 6.

As can be seen from FIG. 6, when an overlapping length B, at which the first band portion and the third band portion overlap each other, was 0.4 mm or more, the second multilayer capacitor was not detached from the first multilayer capacitor and was maintained in a stable coupling state. When the overlapping length B, at which the first band portion and the third band portion overlap each other, was less than 0.3 mm, a detachment rate of the second multilayer capacitor was rapidly increased.

In the case of the present embodiment, electrical and physical connectivity between first and second external electrodes of the first multilayer capacitor and third and fourth external electrodes of the second multilayer capacitor may be deteriorated due to a difference in sizes between the first multilayer capacitor and the second multilayer capacitor. Thus, ESR of the electronic component may be increased and a chip detachment rate may also be increased.

For example, since a bonding area between electrically conductive first and third band portions is decreased as the overlapping length B is decreased, ESR is increased.

In the case in which ESR is 100% when the overlapping length B, at which the first and third band portions fully overlap each other, is 0.6 mm, the ESR is increased more than twice a reference value when the overlapping length B is 0.2 mm or less.

In addition, when the overlapping length B is 0.4 mm or more, the ESR is less than 1.5 times the reference value.

Therefore, when a level, at which ESR-dependent heating characteristics of the multilayer capacitor is significantly increased, is 1.5 times the reference value, the overlapping length B may be, in detail, 0.4 mm or more to secure stability of the electronic component to a certain level or higher.

As described above, durability of a multilayer capacitor against vibrations and deformation may be improved, and a plurality of multilayer capacitors may be stacked to increase capacitance of an electronic component. In addition, an electronic component may be used without increasing a mounting area when it is mounted on a board and changing a design of an electrode pad of the board.

While exemplary embodiments have been shown and described above, it will be apparent to those skilled in the art that modifications and variations could be made without departing from the scope of the present disclosure as defined by the appended claims.

What is claimed is:

1. An electronic component comprising:
a capacitor array in which a plurality of multilayer capacitors, each including a capacitor body and a pair of external electrodes disposed on end portions of the capacitor body opposing in a first direction, are stacked in a second direction perpendicular to the first direction, and a length in the first direction of a multilayer capacitor, disposed on a lower end in the second direction is less than a length in the first direction of another multilayer capacitor; and
a pair of metal frames, respectively disposed to be connected to the pair of external electrodes of the multilayer capacitor disposed on the lower end so as to overlap the another multilayer capacitor in the second direction,
wherein the external electrode comprises:
a head portion disposed on one surface of the capacitor body in the first direction; and
a band portion extending from the head portion to portions of upper and lower surfaces of the capacitor body,
wherein the metal frame comprises:
a connection portion connected to the head portion; and
a mounting portion bent to extend from a lower end of the connection portion in the first direction, and
wherein the connection portion overlaps the another multilayer capacitor in the second direction.

2. The electronic component of claim 1, wherein a conductive bonding layer is disposed between band portions, facing each other, in multilayer capacitors adjacent to each other in the second direction.

3. The electronic component of claim 1, wherein the mounting portion is spaced apart from a lower end of the capacitor array.

4. The electronic component of claim 1, further comprising:
a conductive bonding layer disposed between the connection portion and the head portion.

5. The electronic component of claim 1, wherein two multilayer capacitors are stacked from a lower end of the capacitor array in the second direction in such a manner that portions of band portions, facing each other, overlap each other in the second direction.

6. The electronic component of claim 5, wherein ⅔≤B/A, in which A is a length of the band portion of the multilayer capacitor, disposed on the lower end, in the first direction, and B is a length of the band portions, overlapping each other in the second direction, in the first direction.

7. The electronic component of claim 5, wherein a length of the band portions, overlapping each other in the second direction, in the first direction is 0.4 mm or more.

8. The electronic component of claim 1, wherein the metal frame comprises a bonding portion, bent to extend from an upper end of the connection portion in the first direction, allowing the metal frame to be bonded to a band portion of a multilayer capacitor disposed on an upper side in the capacitor array.

9. The electronic component of claim 8, further comprising:
a conductive bonding layer disposed between the bonding portion and the band portion of the multilayer capacitor disposed on the upper side in the capacitor array.

10. The electronic component of claim 8, wherein the metal frame comprises:
an extension portion bent to extend from an upper end of the connection portion in the first direction; and
an auxiliary connection portion, bent to extend from the extension portion in the second direction, to be bonded to the head portion of the multilayer capacitor disposed on the upper side in the capacitor array.

11. The electronic component of claim 10, further comprising:
a conductive bonding layer disposed between the auxiliary connection portion and the head portion of the multilayer capacitor disposed on the upper side in the capacitor array.

12. The electronic component of claim 10, wherein the auxiliary connection portion is formed to expose a portion of the head portion of the multilayer capacitor disposed on the upper side in the capacitor array.

13. An electronic component, comprising:
a first capacitor having a first capacitor body, a first external electrode disposed on a first surface of the first capacitor body and a second external electrode disposed on a second surface of the first capacitor body opposing the first surface in a length direction, the first capacitor having a first length in the length direction;
a first metal frame having an inner surface thereof contacting the first external electrode, and a second metal frame having an inner surface thereof contacting the second external electrode, the first and second metal frames extending downwardly in a thickness direction; and
a second capacitor disposed above the first capacitor in the thickness direction, the second capacitor having a second capacitor body, a third external electrode disposed on a first surface of the second capacitor body and a fourth external electrode disposed on a second surface of the second capacitor body opposing the first surface in the length direction, the second capacitor having a second length in the length direction, the second length being greater than the first length,
wherein at least one of the first or second metal frames entirely overlaps the second capacitor in the thickness direction.

14. The electronic component of claim 13, wherein
the first and second external electrodes extend over a portion of a pair of surfaces of the first capacitor body opposing each other in a thickness direction to form first and second band portions,
the third and fourth external electrodes extend over a portion of a pair of surfaces of the second capacitor body opposing each other in a thickness direction to form third and fourth band portions.

15. The electronic component of claim 14, wherein the second capacitor is disposed above the first capacitor such that a portion of the first and third band portions overlap in the thickness direction and a portion of the second and fourth band portions overlap in the thickness direction.

16. The electronic component of claim 15, wherein $2/3 \leq B/A$, in which A is a length of the first or second band portions in the length direction, and B is a length in the length direction of the overlapping portion of the first and third band portions, or the second and fourth band portions.

17. The electronic component of claim 14, wherein a conductive bonding layer is disposed between the first and third band portions, and the second and third band portions so as to form an electrical connection between the first and second capacitors.

18. The electronic component of claim 13, wherein the second capacitor comprises a plurality of multilayer capacitors stacked in the thickness direction.

* * * * *